(12) United States Patent
Swaminathan et al.

(10) Patent No.: US 11,802,340 B2
(45) Date of Patent: Oct. 31, 2023

(54) UHV IN-SITU CRYO-COOL CHAMBER

(71) Applicant: Applied Materials, Inc., Santa Clara, CA (US)

(72) Inventors: Bharath Swaminathan, San Jose, CA (US); John Mazzocco, San Jose, CA (US); Hanbing Wu, Millbrae, CA (US); Ashish Goel, Karnataka (IN); Anantha K. Subramani, San Jose, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 704 days.

(21) Appl. No.: 15/839,018

(22) Filed: Dec. 12, 2017

(65) Prior Publication Data

US 2018/0163306 A1 Jun. 14, 2018

Related U.S. Application Data

(60) Provisional application No. 62/433,194, filed on Dec. 12, 2016.

(51) Int. Cl.
*C23C 16/46* (2006.01)
*H01L 21/687* (2006.01)
*H01L 21/67* (2006.01)
*C23C 16/455* (2006.01)
*C23C 16/458* (2006.01)

(52) U.S. Cl.
CPC ........ *C23C 16/466* (2013.01); *C23C 16/4586* (2013.01); *C23C 16/45527* (2013.01); *H01L 21/67098* (2013.01); *H01L 21/67109* (2013.01); *H01L 21/67167* (2013.01); *H01L 21/67184* (2013.01); *H01L 21/67201* (2013.01); *H01L 21/68721* (2013.01); *H01L 21/68728* (2013.01);

(Continued)

(58) Field of Classification Search
CPC ............ C23C 16/466; C23C 16/45527; C23C 16/4586; H01L 21/68742; H01L 21/68721; H01L 21/68785; H01L 21/67109; H01L 21/67184; H01L 21/68728; H01L 21/67201; H01L 21/67098; H01L 21/67167; H01L 21/6875; H01L 21/6833; B25B 11/00; B25B 11/005; B23Q 3/00; B23Q 3/06; B23Q 3/088
USPC ............................. 62/377; 269/21.289 R, 903
See application file for complete search history.

(56) References Cited

U.S. PATENT DOCUMENTS 4,086,555 A * 4/1978 Krikorian ......... H01L 21/02631
257/E21.462
4,508,161 A * 4/1985 Holden ................... H01L 23/34
118/724

(Continued)

FOREIGN PATENT DOCUMENTS

KR 20090097808 A * 9/2009
TW 452838 B * 9/2001

*Primary Examiner* — Len Tran
*Assistant Examiner* — Kirstin U Oswald
(74) *Attorney, Agent, or Firm* — Servilla Whitney LLC (57) ABSTRACT

A cooling chamber comprising a support plate connected to a cryo pump and turbo pump, a clamp ring with a plurality of clamp pads on the bottom thereof where each clamp pad has a beveled surface directed downward and a lift plate to move the clamp ring from a clamp position to a loading position are described. Cluster tools incorporating the cooling chamber and methods of using the cooling chamber are also described.

20 Claims, 7 Drawing Sheets

(52) U.S. Cl.
CPC .. *H01L 21/68742* (2013.01); *H01L 21/68785* (2013.01)

(56) References Cited

U.S. PATENT DOCUMENTS

| | | | | |
|---|---|---|---|---|
| 4,543,059 A * | 9/1985 | Whang | ............... | F27B 5/02 219/390 |
| 4,603,466 A * | 8/1986 | Morley | ............ | H01L 21/68721 269/21 |
| 4,717,461 A * | 1/1988 | Strahl | ............... | H01L 21/67766 204/192.12 |
| 4,842,683 A * | 6/1989 | Cheng | ............... | H01J 37/32788 156/345.46 |
| 4,892,753 A * | 1/1990 | Wang | ............... | H01L 21/31604 427/314 |
| 4,909,314 A * | 3/1990 | Lamont, Jr. | ....... | H01L 21/67098 204/192.12 |
| 4,911,597 A * | 3/1990 | Maydan | ............... | H01L 21/67 294/90 |
| 4,915,564 A * | 4/1990 | Eror | ............... | H01L 21/67201 414/217 |
| 4,917,556 A * | 4/1990 | Stark | ............... | B65G 47/915 414/217 |
| 4,923,584 A * | 5/1990 | Bramhall, Jr. | .... | H01L 21/67751 414/217 |
| 4,938,691 A * | 7/1990 | Ohkase | ............... | C30B 31/103 414/172 |
| 4,944,860 A * | 7/1990 | Bramhall, Jr. | .... | H01L 21/68721 204/192.12 |
| 5,019,233 A * | 5/1991 | Blake | ............... | H01L 21/67201 414/217 |
| 5,094,885 A * | 3/1992 | Selbrede | ............ | C23C 16/4585 118/724 |
| 5,154,582 A * | 10/1992 | Danielson | ............... | B01J 3/006 417/51 |
| 5,215,619 A * | 6/1993 | Cheng | ............... | H01L 21/67069 156/345.46 |
| 5,224,809 A * | 7/1993 | Maydan | ............... | H01L 21/67 414/217 |
| 5,280,983 A * | 1/1994 | Maydan | ............... | H01L 21/67 414/217 |
| 5,292,393 A * | 3/1994 | Maydan | ............ | H01L 21/67167 414/217 |
| 5,310,410 A * | 5/1994 | Begin | ............... | C23C 14/568 414/217 |
| 5,437,757 A * | 8/1995 | Rice | ............... | H01L 21/68721 118/728 |
| 5,494,523 A * | 2/1996 | Steger | ............... | H01J 37/32431 204/192.12 |
| 5,513,594 A * | 5/1996 | McClanahan | ..... | H01L 21/68735 269/254 R |
| 5,685,963 A * | 11/1997 | Lorimer | ............... | C23C 14/564 118/724 |
| 5,725,718 A * | 3/1998 | Banholzer | ......... | H01L 21/68721 118/728 |
| 5,730,801 A * | 3/1998 | Tepman | ............... | H01L 21/67751 156/345.31 |
| 5,753,133 A * | 5/1998 | Wong | ............... | H01L 21/68778 118/503 |
| 5,799,860 A * | 9/1998 | Demaray | ............... | B23K 35/005 228/205 |
| 5,804,042 A * | 9/1998 | Ferreira | ............... | C30B 31/14 204/192.12 |
| 5,810,931 A | 9/1998 | Stevens et al. | | |
| 5,911,834 A * | 6/1999 | Fairbairn | ............... | B01J 4/00 134/1.2 |
| 5,930,661 A * | 7/1999 | Lu | ............... | H01L 21/68721 438/758 |
| 5,942,041 A * | 8/1999 | Lo | ............... | C23C 16/4585 438/758 |
| 5,944,857 A * | 8/1999 | Edwards | ............ | H01L 21/67201 29/25.01 |
| 5,997,651 A * | 12/1999 | Matsuse | ............... | C23C 16/481 118/728 |
| 6,008,134 A * | 12/1999 | Ferguson | .......... | H01L 21/68735 438/631 |
| 6,096,135 A * | 8/2000 | Guo | ............... | H01L 21/67109 118/728 |
| 6,103,069 A * | 8/2000 | Davenport | ............ | C23C 14/566 204/192.12 |
| 6,152,070 A * | 11/2000 | Fairbairn | ............ | C23C 16/4412 118/723 MP |
| 6,176,931 B1 * | 1/2001 | Restaino | ............... | C23C 14/50 118/724 |
| 6,183,564 B1 * | 2/2001 | Reynolds | ............ | H01L 21/6719 156/345.31 |
| 6,184,972 B1 * | 2/2001 | Mizutani | ............... | G03F 7/7075 269/21 |
| 6,187,682 B1 * | 2/2001 | Denning | ............... | C23C 14/358 257/E21.252 |
| 6,217,715 B1 * | 4/2001 | Sun | ............... | C23C 14/564 204/192.15 |
| 6,231,732 B1 * | 5/2001 | Hollars | ................... | H01J 37/34 204/298.25 |
| 6,235,656 B1 * | 5/2001 | Clarke | ............. | H01L 21/67201 438/907 |
| 6,241,477 B1 * | 6/2001 | Brezoczky | ............ | C23C 14/564 417/51 |
| 6,416,647 B1 * | 7/2002 | Dordi | ............... | H01L 21/67051 204/278 |
| 6,451,118 B1 * | 9/2002 | Garriga | ............... | H01L 21/67184 204/298.25 |
| 6,468,353 B1 * | 10/2002 | Perlov | ............... | H01L 21/68764 414/223.01 |
| 6,521,292 B1 * | 2/2003 | Yudovsky | ............. | C23C 16/455 118/500 |
| 6,575,737 B1 * | 6/2003 | Perlov | ............... | H01L 21/68771 414/217 |
| 2001/0036706 A1 * | 11/2001 | Kitamura | .......... | H01L 21/67115 438/795 |
| 2001/0041121 A1 * | 11/2001 | Grunes | ............... | H01L 21/67196 414/217 |
| 2002/0088797 A1 * | 7/2002 | Ramaswamy | .... | H01L 21/67098 219/634 |
| 2002/0159864 A1 * | 10/2002 | Lowrance | ......... | H01L 21/67126 414/217 |
| 2002/0190052 A1 * | 12/2002 | Kitamura | .......... | H01L 21/67109 219/390 |
| 2003/0066606 A1 * | 4/2003 | Clarke | ............... | H01L 21/67115 156/345.31 |
| 2004/0177813 A1 * | 9/2004 | Schieve | ............ | H01L 21/68742 118/728 |
| 2005/0145614 A1 * | 7/2005 | Wu | ............... | F27D 19/00 219/390 |
| 2007/0056843 A1 * | 3/2007 | Ye | ............... | C23C 14/3407 204/192.1 |
| 2007/0084720 A1 * | 4/2007 | Hosokawa | .......... | H01J 37/3438 204/298.16 |
| 2007/0134821 A1 * | 6/2007 | Thakur | ................ | B08B 7/0057 438/5 |
| 2007/0196011 A1 * | 8/2007 | Cox | ............... | G01N 21/33 382/145 |
| 2008/0206987 A1 * | 8/2008 | Gelatos | ............. | C23C 16/45523 438/654 |
| 2008/0282710 A1 * | 11/2008 | Bartlett | ............... | H01L 21/6719 62/55.5 |
| 2011/0203310 A1 * | 8/2011 | Gomi | ............... | B01D 53/002 95/205 |
| 2012/0312234 A1 | 12/2012 | Nasman et al. | | |
| 2013/0112334 A1 * | 5/2013 | Tsuno | ............... | H01L 21/67109 156/64 |
| 2014/0105709 A1 * | 4/2014 | Abarra | ............... | H01L 21/68785 414/222.01 |
| 2016/0343595 A1 * | 11/2016 | Lind | ............... | C23C 16/45565 |
| 2017/0062246 A1 * | 3/2017 | Wu | ............... | H01L 21/6838 |

* cited by examiner

UHV IN-SITU CRYO-COOL CHAMBER

CROSS-REFERENCE TO RELATED APPLICATIONS

This application claims priority to U.S. Provisional Application No. 62/433,194, filed Dec. 12, 2016, the entire disclosure of which is hereby incorporated by reference herein.

TECHNICAL FIELD

The present disclosure relates generally to apparatus to rapidly cool semiconductor wafers to cryogenic temperatures and methods of use. In particular, embodiments of the disclosure are directed to apparatus to rapidly cool semiconductor wafers as stand-alone systems or incorporated into cluster tools.

BACKGROUND

Semiconductor device formation is commonly conducted in substrate processing systems or platforms containing multiple chambers, which may also be referred to as cluster tools. In some instances, the purpose of a multi-chamber processing platform or cluster tool is to perform two or more processes on a substrate sequentially in a controlled environment. In other instances, however, a multiple chamber processing platform may only perform a single processing step on substrates. The additional chambers can be employed to maximize the rate at which substrates are processed. In the latter case, the process performed on substrates is typically a batch process, wherein a relatively large number of substrates, e.g. 25 or 50, are processed in a given chamber simultaneously. Batch processing is especially beneficial for processes that are too time-consuming to be performed on individual substrates in an economically viable manner, such as for atomic layer deposition (ALD) processes and some chemical vapor deposition (CVD) processes.

During processing, many parameters are controlled including the temperature of the wafer. In some processes, decreasing the temperature of a semiconductor wafer during processing can change film properties. However, cooling the wafer temperature can be a time-consuming process that can affect the overall throughput of a process performed in a batch processing chamber.

Therefore, there is a need in the art for apparatus and methods to rapidly cool the temperature of a semiconductor wafer without significantly affecting the overall system throughput.

SUMMARY

One or more embodiments of the disclosure are directed to cooling chambers comprising a support plate connected to a cryo pump and a turbo pump. The support plate has a top surface to support a wafer. The cooling chamber includes a clamp ring having a top, bottom, inner diameter, outer diameter and a plurality of clamp pads on the bottom. Each clamp pad has a beveled surface directed downward and toward the inner diameter. A lift plate is included to move the clamp ring from a clamp position to a loading position.

Additional embodiments of the disclosure are directed to cluster tools comprising a central transfer station with a plurality of sides, a robot and a cooling chamber. The robot is positioned within the central transfer station and is configured to move a robot blade to each of the plurality of sides. The cooling chamber is connected to a side of the central transfer station. The cooling chamber includes a support plate connected to a cryo pump and turbo pump. The support plate has a top surface to support a wafer. A clamp ring having a top, bottom, inner diameter, outer diameter and a plurality of clamp pads on the bottom is included. Each clamp pad has a beveled surface directed downward and toward the inner diameter. A lift plate is included to move the clamp ring from a clamp position to a loading position.

Further embodiments of the disclosure are directed to methods of cooling a wafer. A wafer is positioned in a cooling chamber comprising a support plate connected to a cryo pump and turbo pump. The support plate has a top surface to support a wafer. A clamp ring has a top, bottom, inner diameter, outer diameter and a plurality of clamp pads on the bottom. Each clamp pad has a beveled surface directed downward and toward the inner diameter. A lift plate moves the clamp ring from a clamp position to a loading position. The wafer is cooled to a temperature less than about 150 K using the cryo pump.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

DETAILED DESCRIPTION

Before describing several exemplary embodiments of the disclosure, it is to be understood that the disclosure is not limited to the details of construction or process steps set forth in the following description. The disclosure is capable of other embodiments and of being practiced or being carried out in various ways.

A "substrate" as used herein, refers to any substrate or material surface formed on a substrate upon which film processing is performed during a fabrication process. For example, a substrate surface on which processing can be performed include materials such as silicon, silicon oxide, strained silicon, silicon on insulator (SOI), carbon doped silicon oxides, amorphous silicon, doped silicon, germanium, gallium arsenide, glass, sapphire, and any other materials such as metals, metal nitrides, metal alloys, and other conductive materials, depending on the application. Substrates include, without limitation, semiconductor wafers. Substrates may be exposed to a pretreatment process to polish, etch, reduce, oxidize, hydroxylate, anneal and/or bake the substrate surface. In addition to film processing directly on the surface of the substrate itself, in the present disclosure, any of the film processing steps disclosed may also be performed on an under-layer formed on the substrate as disclosed in more detail below, and the term "substrate surface" is intended to include such under-layer as the context indicates. Thus for example, where a film/layer or partial film/layer has been deposited onto a substrate surface, the exposed surface of the newly deposited film/layer becomes the substrate surface.

As used in this specification and the appended claims, the terms "precursor", "reactant", "reactive gas" and the like are used interchangeably to refer to any gaseous species that can react with the substrate surface.

Embodiments of the disclosure provide a cryogenic cooling system that can be used as a stand-alone component or integrated into a batch processing system. An in-situ wafer cooling station can be used to pre-cool wafers to a temperature in the range of less than about 100 K to room temperature (~293 K) to about 100° C. (373 K). Some embodiments of the disclosure advantageously provide cooling chambers that can be used to reduce film roughness and tunneling magneto-resistance in a deposited film.

Some embodiments of the disclosure provide systems with higher vacuum levels ($10^{-9}$ Torr) than are currently reached ($10^{-8}$ Torr). The system can incorporate a mechanical clamping component with a back side gas flow to increase the effectiveness of heat transfer. In some embodiments, a wafer can be cooled from about room temperature to 110 K in less than 3 minutes.

Some embodiments of the disclosure provide apparatus and methods to load and unload wafers from the cryogenic chamber using a robot blade and wafer clamp.

Some embodiments of the disclosure provide gas conduction and choking which can be increased using a backside gas line with cooled gas to improve heat transfer between the cold plate and the wafer. The backside gas line can be evacuated using an integrated turbo pump or through a separate vacuum source. In some embodiments, a ball mechanism provides a thermal choke to prevent the stage from losing heat during use.

Figure 1:
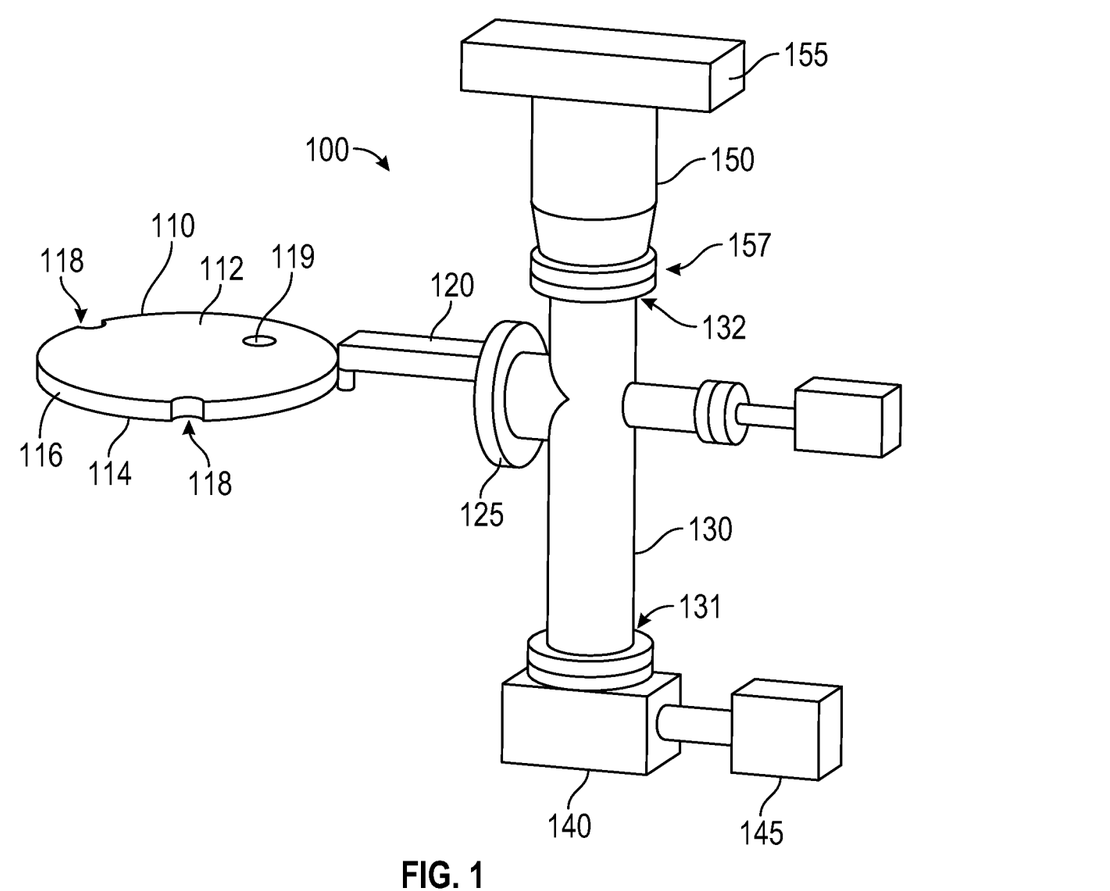
FIG. 1 shows a view of a cooling assembly in accordance with one or more embodiment of the disclosure.
Figure 2:
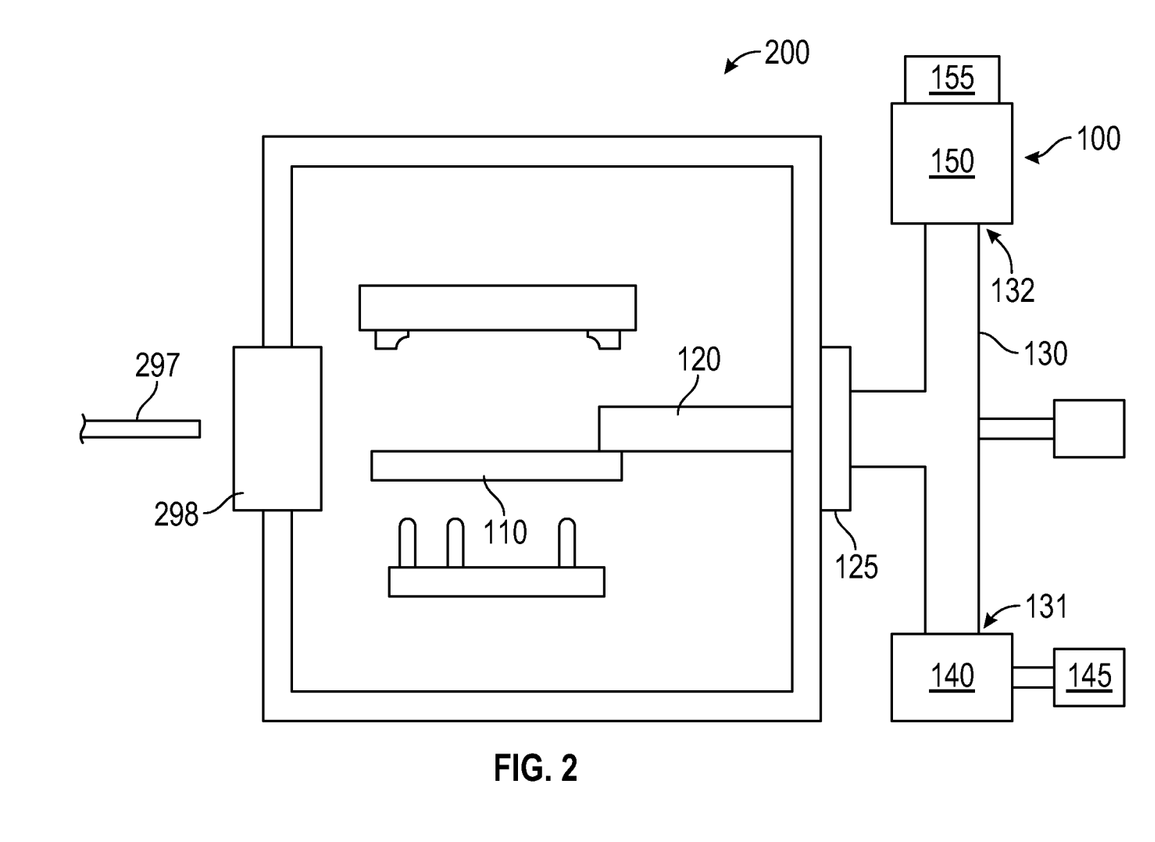
FIG. 2 shows a cross-sectional schematic view of a cooling chamber in accordance with one or more embodiment of the disclosure.

FIGS. 1 through 6 show one or more embodiments of a cooling chamber 200 or a cooler assembly 100. FIG. 1 shows a perspective view of a cooling assembly 100 in accordance with one or more embodiment of the disclosure. FIG. 2 shows a schematic representation of a cooling chamber 200 using the cooler assembly 100. FIG. 2 is an abbreviated view showing minimal components to illustrate the general configuration of the chamber 200. Additional views of the individual components are found throughout the drawings.

Referring to FIG. 1 one or more embodiments of the disclosure are directed to cooler assemblies 100. The cooler assembly 100 includes a support plate 110 with a top surface 112, a bottom surface 114 and sides 116. The sides of the support plate 110 can include one or more openings 118 on the sides 116. The openings 118 can be sized to fit around other components which may be used with or adjacent to the cooler assembly 100.

The support plate 110 can be any suitable shape and size depending on, for example, the size and shape of a wafer to be cooled using the cooler assembly 100. In some embodiments, the support plate 110 is generally disc shaped having a thickness and an average diameter. A generally disc shaped support plate 110 can have one or more openings 118 or passages 119 formed through the thickness.

The support plate 110 is connected to a support arm 120. The support arm 120 can be movable or stationary. In some embodiments, the support arm 120 is configured to move in the z-axis to move the support plate 110 vertically.

The support arm 120 can be connected to a flange 125 which can be connected to the outer surface of a processing chamber 200, as shown in FIG. 2. The flange 125 allows the support plate 110 and support arm 120 to be positioned within a process chamber while the remaining components of the cooler assembly 100 are outside of the processing chamber 200.

The flange 125 can be connected to a housing 130 which can allow other components to be connected to the support plate 110 through the support arm 120. In the embodiments shown in FIGS. 1 and 2, a cryo pump 140 is connected to the bottom end 131 of the housing 130. While the embodiment shown has a vertically oriented housing 130, those skilled in the art will understand that this is merely representative of one possible configuration and that other shapes and orientations are within the scope of the disclosure. A cry pump controller 145 is connected to the cryo pump 140 to control the operation of the cryo pump 140. The cryo pump 140 can be any suitable cryo pump including, but not limited to, sorption pumps and cryo pumps that utilize liquid or compressed helium, dry ice, liquid nitrogen or have built-in cryocoolers. Condensation can be collected in the bottom of the cryopump and removed by tubing to allow the water to flow to waste, or by a flow of dry gas across the condensation collection area.

The cryo pump 140 can cool the wafer temperature to less than about 100 K. In some embodiments, the cryo pump 140 can maintain a temperature in the range of about 100 K to about 373 K. In some embodiments, the cryo pump 140 can cool the wafer to a temperature less than about room temperature, 250 K, 200 K, 150 K or 100 K.

In the embodiment shown, a turbo pump 150 is connected to the top end 132 of the housing 130. A turbo pump controller 155 is connected to the turbo pump 150 to control the operation of the turbo pump 150. The turbo pump 150 can be any suitable turbomolecular pump capable of reaching a predetermined pressure range. In some embodiments, the turbo pump 150 is integrated into the housing 130 at junction 157 to prevent leakage of gases into the processing chamber.

Referring to FIGS. 3 through 6, the cooling chamber 200 includes a clamp ring 210. The clamp ring 210 has a top 211 and bottom 212 defining a thickness. The clamp ring 210 has an inner diameter edge 213 and outer diameter edge 214. In some embodiments, the clamp ring 210 includes one or more notched areas 215 which can be used to provide clearance for other components in the cooling chamber 200. For example, the notched area 215 in the embodiments shown in FIG. 4 can fit around the support arm 120 when the components are in close proximity.

The clamp ring 210 includes a plurality of clamp pads 220 positioned against the bottom 212 and distributed around the inner diameter edge 213. The clamp pad 220 has a beveled surface 222 directed downward and toward the inner diameter edge 213 of the clamp ring 210. The clamp pad 220 can be any suitable shape and size. In some embodiments, the clamp pad 220 is generally round with a disc-like shape including the beveled surface 222.

The number of clamp pads 220 can vary depending on, for example, the size of the clamp pads 220, the size of the clamp ring 210, the size of the wafer or the size of the cooling chamber 200. In some embodiments, there are at least three clamp pads 220. In some embodiments, there are in the range of 3 to 24 clamp pads 220, or in the range of 3 to 18 clamp pads 220, or in the range of 3 to 12 clamp pads 220, or in the range of 4 to 10 clamp pads 220, or in the range of 5 to 8 clamp pads, or 6 clamp pads.

The inner edge 223 of the clamp pads 220 can extend beyond the inner diameter edge 213 of the clamp ring 210. In some embodiments, the clamp pads 220 do not extend beyond the inner diameter edge 213 of the clamp ring 210.

The clamp pads 220 can be made from any suitable material including, but not limited to, quartz or thermally insulating materials. In some embodiments, the clamp pads 220 are made of quartz.

The clamp pads 220 can be connected to the clamp ring 210 by a permanent connection or by a releasable connection. In the embodiments shown, the clamp pads 220 are connected to the clamp ring 210 by one or more clamp bolts 224. The clamp bolts 224 can be positioned within recessed holes 226 in the clamp pads 220 so that the head of the clamp bolts 224 are not exposed. Recessing the clamp bolts 224 can prevent or minimize any contact damage that might occurs if the clamp ring 210 were to contact the wafer.

The clamp pads 220 can be connected directly to the bottom 212 of the clamp ring 210. In some embodiments, the clamp pads 220 are positioned within recesses 229 formed in the bottom 212 of the clamp ring 210. The recesses 229 can be oversized or can fit the clamp pads snugly. In some embodiments, the recesses 229 are sized to provide an interference fit around the clamp pads 220 so that the clamp pads are held in place without additional hardware.

Figure 5:
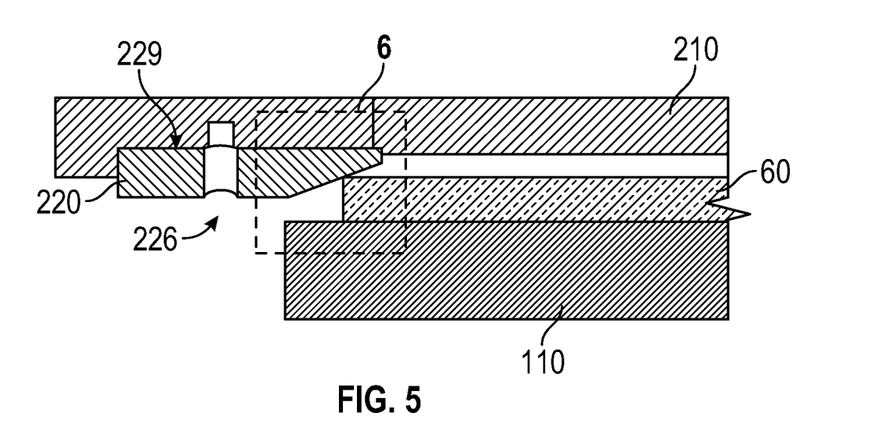
FIG. 5 shows a partial cross-sectional view of the cooling chamber in accordance with one or more embodiment of the disclosure.
Figure 6:
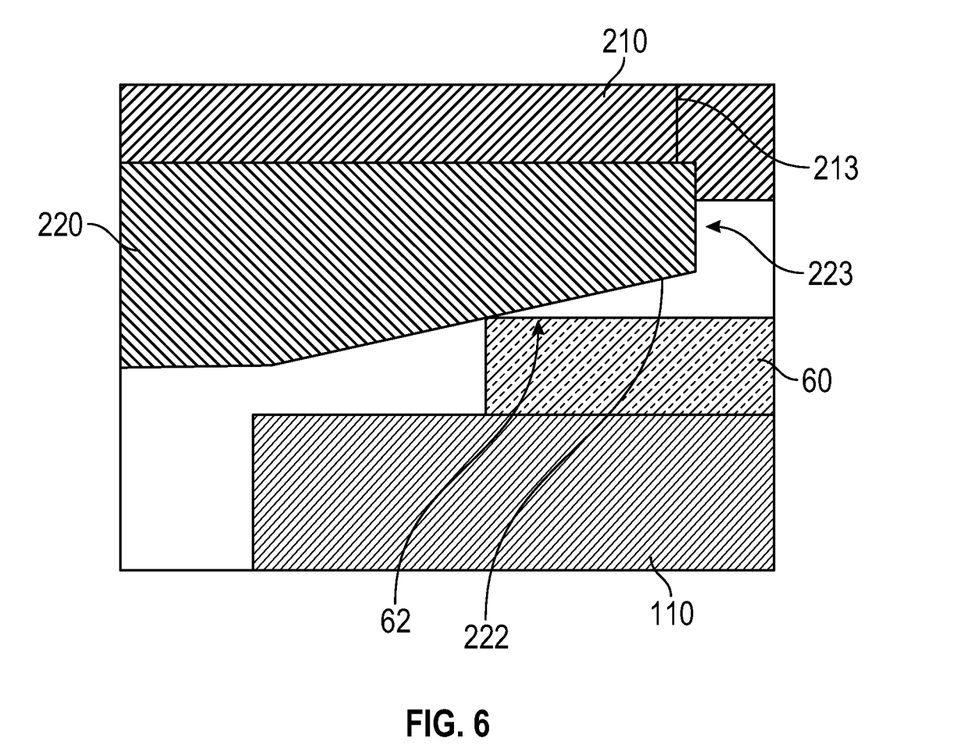
FIG. 6 shows an expanded view of region 6 from FIG. 5.

FIGS. 5 and 6 shows the clamp pads 220 and clamp ring 210 in use clamping a wafer 60 to the support plate 110. FIG. 5 shows a partial expanded view of the edge of the wafer 60 with the clamp pad 220 in contact. FIG. 6 shows a further expanded view of region 6 of FIG. 5. In the embodiment shown, the clamp ring 210 has been lowered, or the wafer 60 has been raised, so that the beveled surface 222 of the clamp pad 220 is in contact with an edge exclusion region 62 of the wafer 60. The edge exclusion region 62 (also referred to as an edge exclusion zone) of the wafer 60 is a region around the outer peripheral edge of the wafer 60 that no devices are formed on. The edge exclusion region 62 provides an area on the wafer 60 that can be contacted without damaging the devices being formed thereon.

The beveled surface 222 of the clamp pad 220 allows for a minimal amount of contact at the edge exclusion zone. The beveled surface 222 also allows for downward pressure to be applied only to the edge exclusion region 62 of the wafer 60 to hold the wafer to the support plate 110.

Figure 9A:
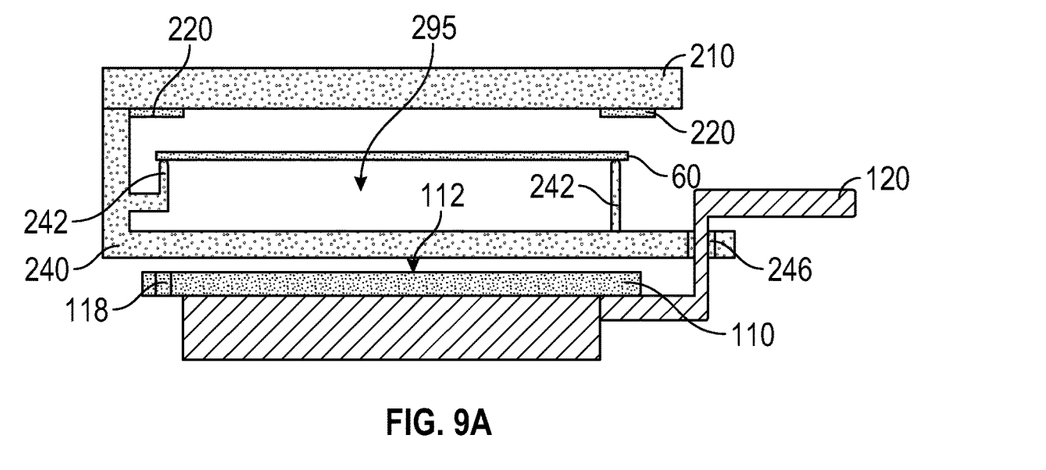
FIGS. 9A through 9C show a schematic representation of a method of cooling a wafer in accordance with one or more embodiment of the disclosure.

Referring back to FIG. 3, some embodiments include a lift plate 240 to move the wafer 60 from a clamp position (as shown in FIG. 5) to a loading position (as shown in FIG. 9A).

Figure 3:
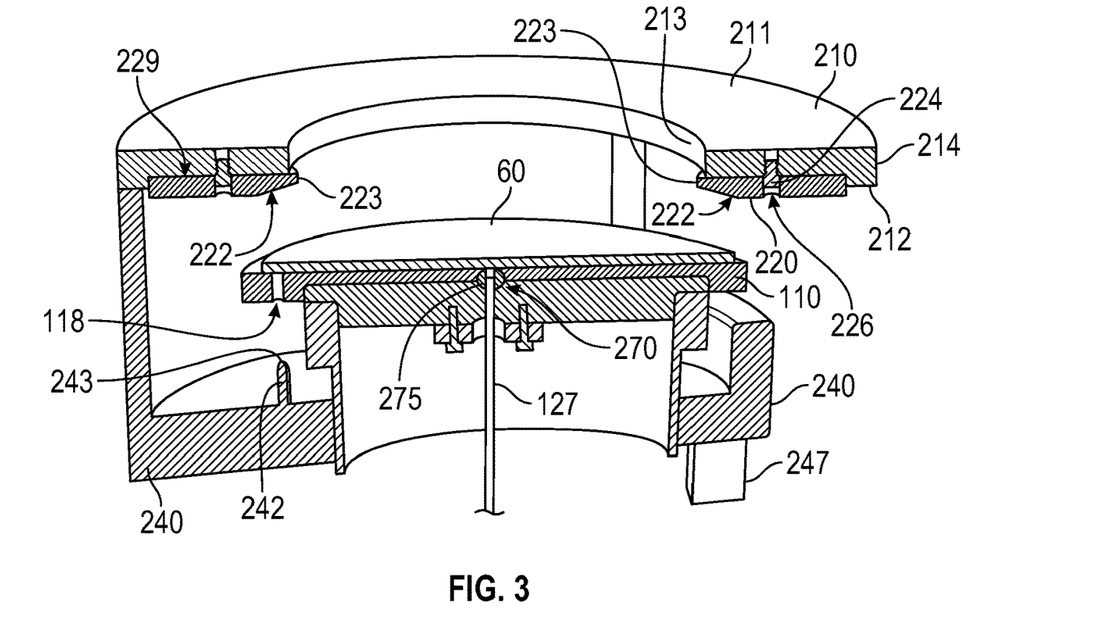
FIG. 3 shows a cross-sectional perspective view of a cooling chamber in accordance with one or more embodiment of the disclosure.
Figure 4:
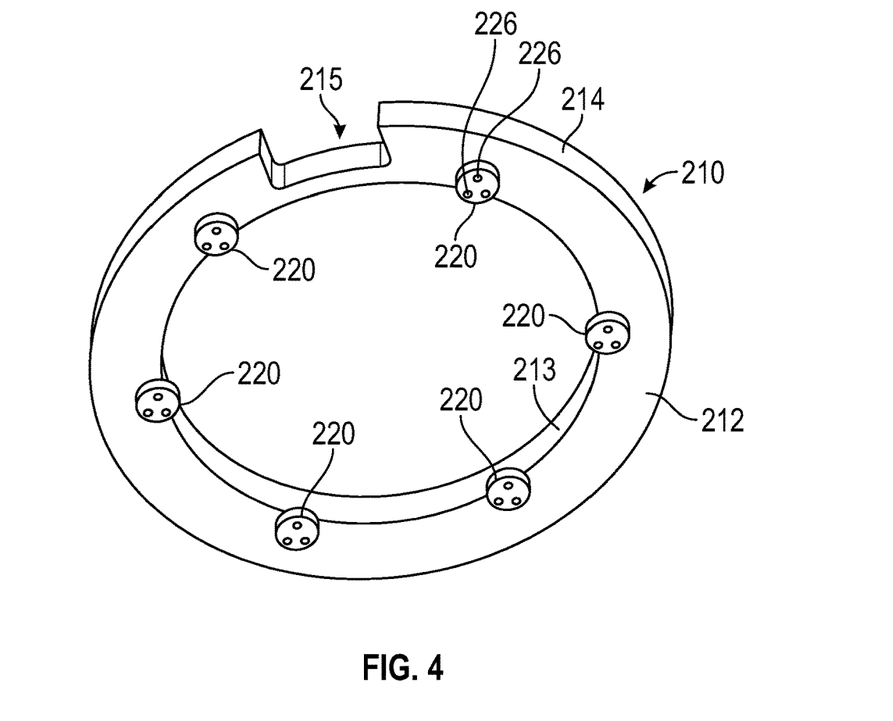
FIG. 4 shows a perspective view of a clamp ring in accordance with one or more embodiment of the disclosure.

The lift plate 240 of some embodiments includes a plurality of lift pins 242. While FIG. 3 shows only one lift pin 242, those skilled in the art will understand that more than one lift pin 242 can be included. For example, in some embodiments, there are at least three lift pins 242. The lift pins 242 have a top 243 that is suitable for contact with a wafer. For example, the top 243 of the lift pin 242 can be quartz, or a low friction material to prevent sliding of the wafer on the lift pins 242.

In some embodiments, the lift plate 240 is connected to the clamp ring 210 so that the lift plate 240 moves the clamp ring 210 and the wafer 60. The support plate 110 can include opening 118 to allow the lift pin 242 on the lift plate 240 to pass through the opening 118.

In some embodiments, the lift plate 240 is connected to a motor 247 to move the lift plate 240 between a loading position and a processing position. The motor 247 can be any suitable type of motor that can move the lift plate 240 in the z-axis.

In some embodiments, the lift plate 240 includes one or more openings 246 that may be located and sized to allow the lift plate 240 to move near other components without contacting the components. For example, as described with respect to FIG. 9A, the opening 246 may be sizes to allow the lift plate 240 to move adjacent the support arm 120.

Figure 7:
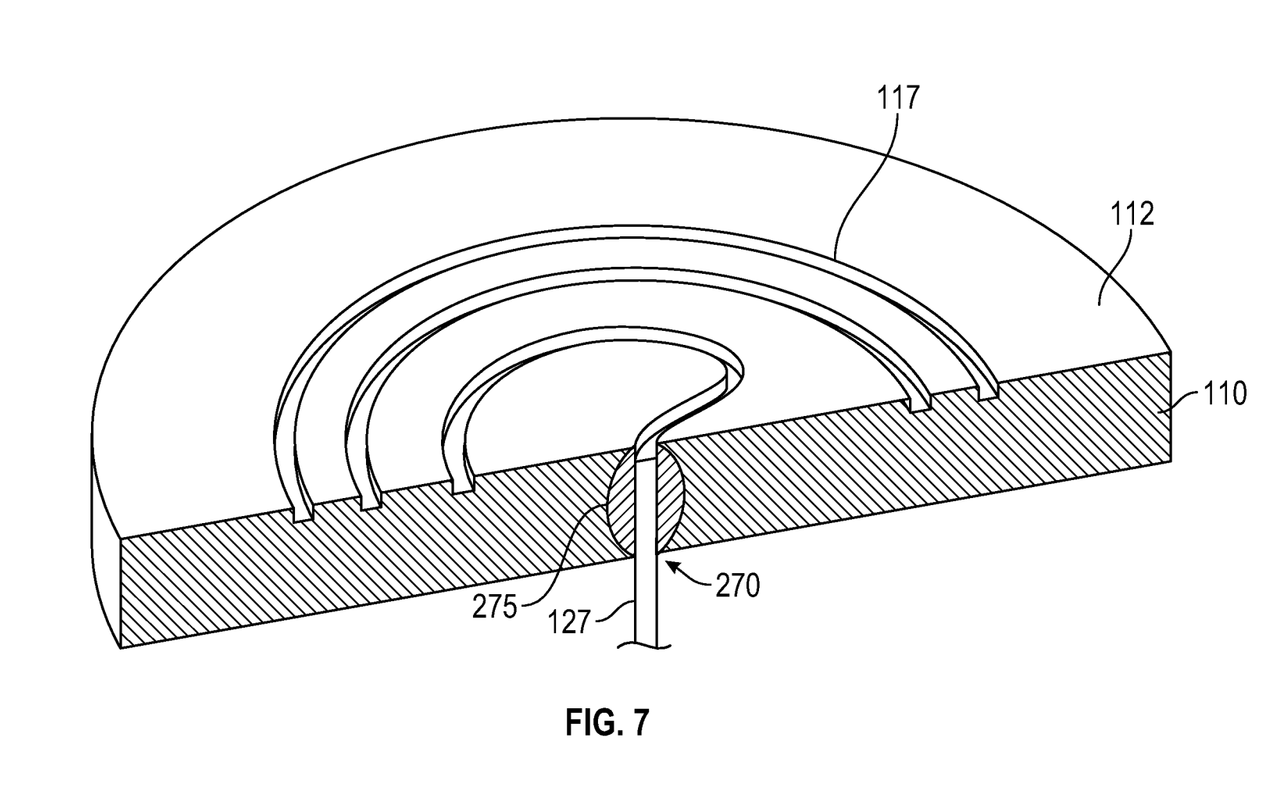
FIG. 7 shows a cross-sectional perspective view of support plate in accordance with one or more embodiment of the disclosure.

Referring to FIG. 7, some embodiments of the support plate 110 include at least one channel 117 formed in the top surface 112. The channel 117 allows for a flow of gas against the back side of the wafer during cooling. The backside gas flow can be used to increase the heat transfer between the wafer and the support plate 110. While the view shows a cross-section of the support plate 110, the channel 117 shown in the Figure is a single spiral. The shape and number of channels 117 can vary depending on, for example, the size of the support plate 110 and the heat transfer properties of the gas. The channel 117 formed in the top surface 112 allows a flow of gas to pass beneath a wafer positioned on the top surface 112.

The support plate 110 of some embodiments further comprises a backside gas line 127 connected to the bottom surface 114 of the support plate 110 and in fluid communication with the at least one channel 117. The backside gas line 127 connects to the support plate 110 at junction 270. The junction 270 can be a simple flange style connection that bolts the backside gas line 127 in place.

The backside gas line 127 can be connected to and in fluid communication with a gas source. In some embodiments, the gas source comprises argon. The backside gas line can be maintained at a fixed pressure range. The gas entering the chamber 200 through the backside gas line 127 can be removed from the chamber 200 using the turbo pump 150. In some embodiments, the pressure in the backside gas line 127 and the channel 117 is in the range of about 1 Torr to about 10 Torr.

In some embodiments, the backside gas line 127 is connected to the support plate 110 through a thermal choke 275. The thermal choke 275 can be any suitable connection that limits the thermal conductivity between the support plate 110 and the backside gas line 127. For example, FIG. 7 shows a ball shaped thermal choke 275 which provides better regulation of the temperature of the support plate 110 by preventing thermal differences in the backside gas line 127 from changing the temperature of the support plate 110. In some embodiments, the thermal choke 275 is made of a thermally insulating material. In some embodiments, the thermal choke 275 is made of quartz.

Figure 8:
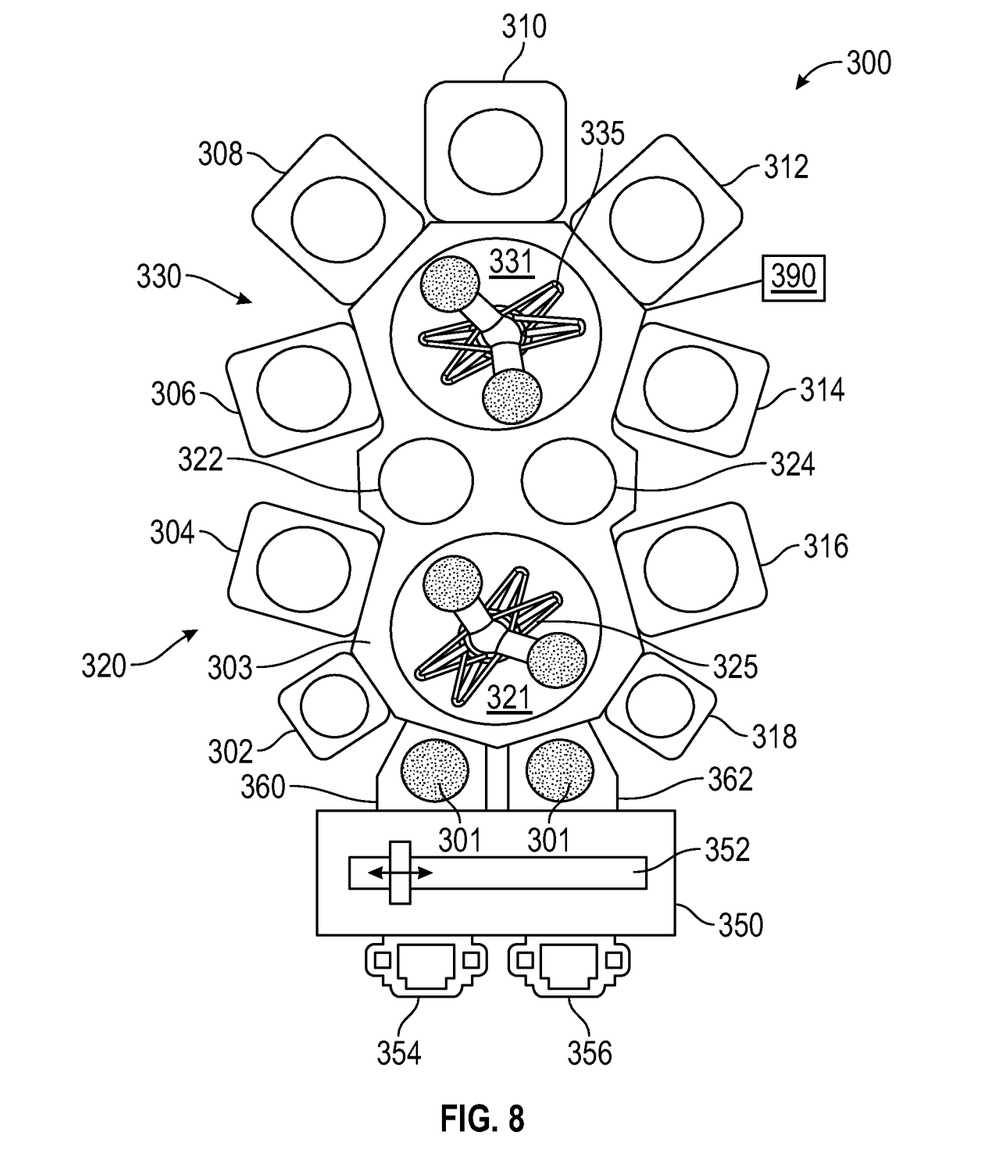
FIG. 8 shows a schematic view of a cluster tool in accordance with one or more embodiment of the disclosure.

Some embodiments of the disclosure are directed to cluster tools 300, as shown in FIG. 8. The cluster tool 300 includes at least one central transfer station with a plurality of sides. A robot is positioned within the central transfer station and is configured to move a robot blade to each of the plurality of sides.

FIG. 8 shows a schematic diagram of an illustrative multiple chamber semiconductor processing tool, also referred to as a cluster tool or multi-cluster tool. The cluster tool 800 comprises a plurality of processing chambers 302, 304, 306, 308, 310, 312, 314, 316, 318. The various processing chambers can be any suitable chamber including, but not limited to, a preclean chamber, a buffer chamber, transfer space(s), a wafer orienter/degas chamber, a cryo cooling chamber, and a transfer chamber. The particular arrangement of process chambers and components can be varied depending on the cluster tool and should not be taken as limiting the scope of the disclosure.

In the embodiment shown in FIG. 8, a factory interface 350 is connected to a front of the cluster tool 300. The factory interface 350 includes a loading chamber 354 and an unloading chamber 356 on a front 351 of the factory interface 350. While the loading chamber 354 is shown on the left and the unloading chamber 356 is shown on the right, those skilled in the art will understand that this is merely representative of one possible configuration.

The size and shape of the loading chamber 354 and unloading chamber 356 can vary depending on, for example, the substrates being processed in the cluster tool 300. In the embodiment shown, the loading chamber 354 and unloading chamber 356 are sized to hold a wafer cassette with a plurality of wafers positioned within the cassette.

A robot 352 is within the factory interface 350 and can move between the loading chamber 354 and the unloading chamber 356. The robot 352 is capable of transferring a wafer from a cassette in the loading chamber 354 through the factory interface 350 to load lock chamber 360. The robot 352 is also capable of transferring a wafer from the load lock chamber 362 through the factory interface 350 to a cassette in the unloading chamber 356. As will be understood by those skilled in the art, the factory interface 350 can have more than one robot 352. For example, the factory interface 350 may have a first robot that transfers wafers between the loading chamber 354 and load lock chamber 360, and a second robot that transfers wafers between the load lock 362 and the unloading chamber 356.

The cluster tool 300 shown has a first section 320 and a second section 330. The first section 320 is connected to the factory interface 350 through load lock chambers 360, 362. The first section 320 includes a first transfer chamber 321 with at least one robot 325 positioned therein. The robot 325 is also referred to as a robotic wafer transport mechanism. The first transfer chamber 321 is centrally located with respect to the load lock chambers 360, 362, process chambers 302, 304, 316, 318 and buffer chambers 322, 324. The robot 325 of some embodiments is a multi-arm robot capable of independently moving more than one wafer at a time. In some embodiments, the first transfer chamber 321 comprises more than one robotic wafer transfer mechanism. The robot 325 in first transfer chamber 321 is configured to move wafers between the chambers around the first transfer chamber 321. Individual wafers are carried upon a wafer transport blade that is located at a distal end of the first robotic mechanism.

After processing a wafer in the first section 320, the wafer can be passed to the second section 330 through a pass-through chamber. For example, chambers 322, 324 can be uni-directional or bi-directional pass-through chambers. The pass-through chambers 322, 324 can be used, for example, to cryo cool the wafer before processing in the second section 330, or allow wafer cooling or post-processing before moving back to the first section 320.

In some embodiments, a cooling chamber 200 is connected to a side of the central transfer station 321, 331. The cooling chamber 200 includes a support plate connected to a cryo pump and turbo pump. The cryo pump and turbo pump can be located outside of the cooling chamber 200 to allow access to the units from outside the cluster tool. In some embodiments, the cooling chamber 200 is incorporated into the cluster tool 300 in either chamber 322, 324 and can act as a pass-through.

One or more embodiments of the disclosure are directed to cluster tools 300. The cluster tool 300 comprises a body 303 with a first section 320 and a second section 330. The first section 320 includes a first central transfer chamber 321 and a first plurality of processing chambers 302, 304, 316, 318. Each of the first plurality of processing chambers is connected to the first central transfer chamber 321 and is accessible by a first robot 325 located in the first central transfer chamber 321. The second section 330 includes a second central transfer chamber 331 and a second plurality of processing chambers 306, 308, 310, 312, 314. Each of the second plurality of processing chambers is connected to the second central transfer chamber 331 and is accessible by a second robot 335 located in the second central transfer chamber 331.

A system controller 390 is in communication with the first robot 325, second robot 335, first plurality of processing chambers 302, 304, 316, 318 and second plurality of processing chambers 306, 308, 310, 312, 314. The system controller 390 can be any suitable component that can control the processing chambers and robots. For example, the system controller 390 can be a computer including a central processing unit, memory, suitable circuits and storage.

It has been surprisingly found that incorporating a cooling chamber 200 into the cluster tool 300 allows for a decrease in pressure of the overall cluster tool 300. For example, a cluster tool 300 is typically able to maintain a pressure of about $10^{-8}$ Torr. The inventors have found that incorporating the cooling chamber 200 decreased the pressure to the low-mid $10^{-9}$ Torr range. In some embodiments, a pressure in the central transfer station 321, 331 is decreased by greater than about ½ order of magnitude or 1 order of magnitude when the cooling chamber is set to a temperature less than about 150 K.

With reference to FIGS. 2 and 9A through 9C, some embodiments of the disclosure are directed to methods of cooling a wafer 60. FIG. 9A shows an embodiment of the cooling chamber in the loading position where the wafer 60 is supported by the lift pins 242 so that there is a space 295 between the wafer 60 and the support plate 110. The space 295 in the loading/unloading position is large enough to allow a robot blade 297 to pass through slit valve 298 into the chamber 200 to move the wafer 60 in or out of the chamber 200.

The wafer 60 is positioned in the cooling chamber 200 and cooled to a predetermined temperature. In FIG. 9A, the clamp ring 210 and clamp pads 220 are above the wafer 60 and the support plate 110 is below the lift pins 242.

The wafer 60 is positioned on a plurality of lift pins 242 connected to the lift plate 240. The plurality of lift pins 242 are elevated above the top surface 112 of the support plate 110.

Figure 9B:
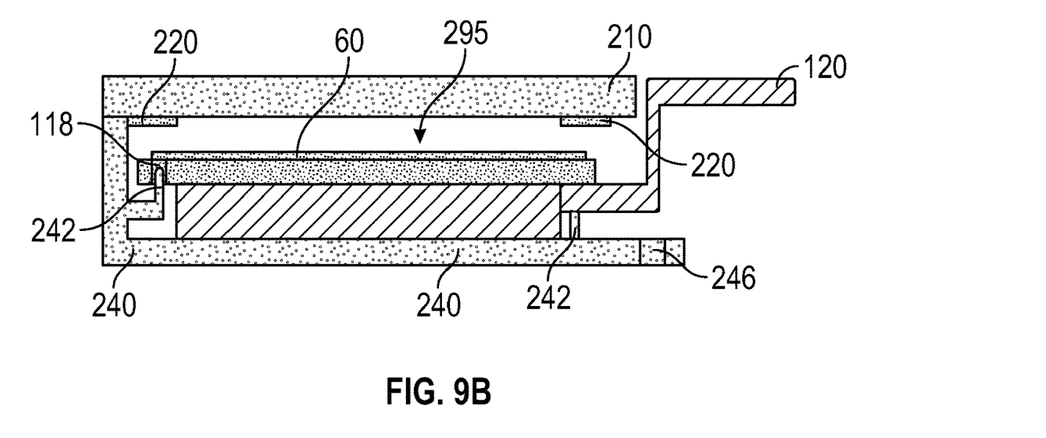

The lift plate 240 is lowered so that the lift pins 242 lower the wafer 60 to contact the top surface 112 of the support plate 110. While lowering the lift pins 242, as shown in FIG.

9B, the lift pins 242 pass through openings 118 and the opening 246 in the lift plate 240 move past the support arm 120.

In FIG. 9B, the lift plate 240 has been lowered to the point where the wafer 60 is resting on the support plate 110 and the lift pins 242 are beginning to move below the wafer 60. In some embodiments, lowering the lift plate 240 causes the lift pins 242 and the clamp ring 210 to be lowered. In some embodiments, the clamp ring 210 is connected to the lift plate 240 so that the movements are coordinated.

Figure 9C:
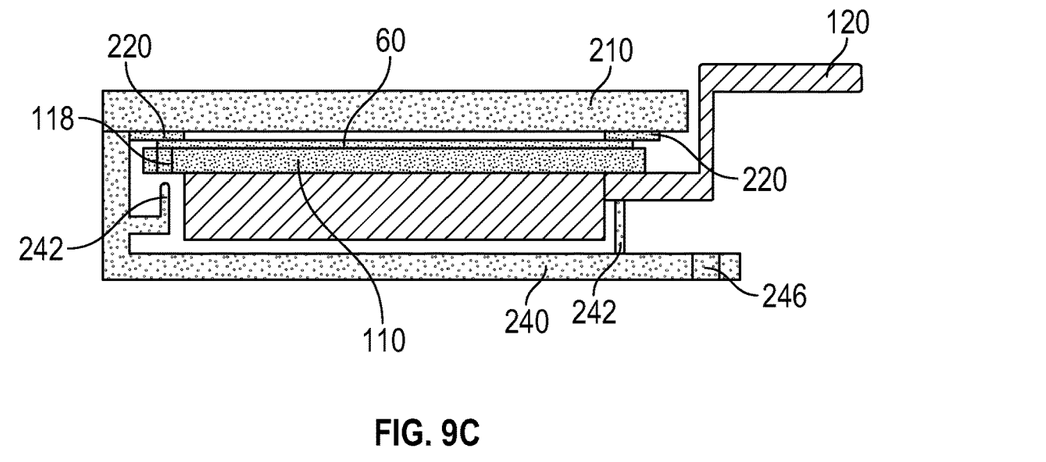

In FIG. 9C, the clamp ring 210 is lowered so that the beveled surface of the clamp pads 220 contact the outer peripheral edge of the wafer 60 in the edge exclusion zone. The contact of the clamp pads 220 with the wafer 60 clamp the wafer 60 to the support plate 110.

After the wafer has been cooled to the predetermined temperature, the wafer 60 can be removed from the chamber 200. Removing the wafer 60 from the cooling chamber 200 is basically a reverse of the loading process. The clamp ring 210 is lifted so that the clamp pads 220 are no longer contacting the wafer 60.

The lift pins 242 are lifted to contact the wafer 60 and elevate the wafer 60 above the top surface 112 of the support plate 110 so that there is a space 295 below the wafer 60 sufficient to allow a robot blade 297 to move between the wafer 60 and the support plate 110. In some embodiments, when in the loading position, the lift plate 240 elevates the lift pins 242 so that a top of the lift pins 242 are above the top surface 112 of the support plate 110 by a distance sufficient to allow a robot 297 blade to pass between the top of the lift pins 242 and the top surface 112 of the support plate 110.

Some embodiments of the disclosure are directed to kits for providing a cooling chamber in an existing cluster tool. The kit of some embodiments includes the cooling assembly 100 shown in FIG. 1. In some embodiments, the kit includes an outer plate for the cluster tool to allow for the positioning of the cooling assembly 100 to allow the cryo pump 140 and turbo pump 150 to remain outside of the cluster tool.

Reference throughout this specification to "one embodiment," "certain embodiments," "one or more embodiments" or "an embodiment" means that a particular feature, structure, material, or characteristic described in connection with the embodiment is included in at least one embodiment of the disclosure. Thus, the appearances of the phrases such as "in one or more embodiments," "in certain embodiments," "in one embodiment" or "in an embodiment" in various places throughout this specification are not necessarily referring to the same embodiment of the disclosure. Furthermore, the particular features, structures, materials, or characteristics may be combined in any suitable manner in one or more embodiments.

Although the disclosure herein has been described with reference to particular embodiments, it is to be understood that these embodiments are merely illustrative of the principles and applications of the present disclosure. It will be apparent to those skilled in the art that various modifications and variations can be made to the method and apparatus of the present disclosure without departing from the spirit and scope of the disclosure. Thus, it is intended that the present disclosure include modifications and variations that are within the scope of the appended claims and their equivalents.

What is claimed is:

1. A cooling chamber comprising:
    a cooler assembly comprising:
        a support plate connected to a support arm, the support plate having a top surface to support a wafer, the support plate and the support arm being positioned inside of the cooling chamber; and
        a housing connected to a cryo pump, a turbo pump and the support arm, the housing, the cryo pump and the turbo pump being positioned outside of the cooling chamber;
    a clamp ring positioned above the support plate, the clamp ring having a top, bottom, inner diameter, outer diameter and a plurality of clamp pads on the bottom, each clamp pad having a beveled surface directed downward and toward the inner diameter; and
    a lift plate to move the wafer.

2. The cooling chamber of claim 1, wherein the cryo pump is configured to cool a wafer on the support plate to a temperature less than 150 K.

3. The cooling chamber of claim 1, wherein the lift plate comprises a plurality of lift pins.

4. The cooling chamber of claim 3, wherein the support plate comprises an opening on a side of the support plate to allow the lift pins to extend therethrough.

5. The cooling chamber of claim 3, wherein the lift plate is connected to the clamp ring and to a motor to move the lift plate and clamp ring between a loading position and a clamp position.

6. The cooling chamber of claim 5, wherein when in the loading position, the lift plate elevates the lift pins so that a top of the lift pins are above the top surface of the support plate by a distance sufficient to allow a robot blade to pass between the top of the lift pins and the top surface of the support plate.

7. The cooling chamber of claim 1, wherein the lift plate is connected to the clamp ring.

8. The cooling chamber of claim 1, wherein the clamp pads are connected to the clamp ring by a releasable connection.

9. The cooling chamber of claim 1, wherein the support plate comprises at least one channel formed in the top surface to allow a flow of gas to pass beneath a wafer positioned on the top surface.

10. The cooling chamber of claim 9, wherein the support plate further comprises a backside gas line connected to a back surface of the support plate and in fluid communication with the at least one channel.

11. The cooling chamber of claim 10, wherein the backside gas line is connected to the support plate through a thermal choke.

12. The cooling chamber of claim 11, wherein the thermal choke is made from a material comprising quartz.

13. The cooling chamber of claim 1, wherein the clamp pads are made of a thermally insulating material.

14. A cluster tool comprising:
    a central transfer station with a plurality of sides;
    a robot positioned within the central transfer station and configured to move a robot blade to each of the plurality of sides; and
    a cooling chamber according to claim 1.

15. The cluster tool of claim 14, wherein a pressure in the central transfer station is decreased by half, relative to a central transfer station without a cooling chamber, when the cooling chamber is set to a temperature less than 150 K.

16. A method of cooling a wafer, the method comprising:
    positioning a wafer in a cooling chamber according to claim 1; and
    cooling the wafer to a temperature less than 150 K using the cryo pump.

17. The method of claim 16, wherein positioning the wafer in the cooling chamber comprises:
- positioning the wafer on a plurality of lift pins connected to the lift plate, the plurality of lift pins elevated above the top surface of the support plate;
- lowering the lift plate so that the lift pins lower the wafer to contact the top surface of the support plate; and
- lowering the clamp ring so that the beveled surface of the clamp pads contacts an outer peripheral edge of the wafer to clamp the wafer to the support plate.

18. The method of claim 17, further comprising flowing a cooling gas through a plurality of channels in the top surface of the support plate after the wafer is clamped to the support plate.

19. The method of claim 18, further comprising removing the wafer from the cooling chamber, wherein removing the wafer comprises:
- lifting the clamp ring so that the clamp pads are no longer contacting the wafer; and
- lifting the lift pins to contact the wafer and elevate the wafer above the top surface of the support plate so that there is a space below the wafer sufficient to allow a robot blade to move between the wafer and the support plate.

20. The cooling chamber of claim 1, wherein the beveled surface of each clamp pad contacts an edge exclusion region of the wafer when the wafer is in a clamp position.

* * * * *